(12) United States Patent
Wei et al.

(10) Patent No.: US 9,449,834 B2
(45) Date of Patent: *Sep. 20, 2016

(54) METHOD OF FABRICATING SEMICONDUCTOR DEVICES INCLUDING PMOS DEVICES HAVING EMBEDDED SIGE

(75) Inventors: Qingsong Wei, Beijing (CN); Wei Lu, Beijing (CN); Wuping Liu, Beijing (CN); Yonggen He, Beijing (CN)

(73) Assignee: SEMICONDUCTOR MANUFACTURING INTERNATIONAL (BEIJING) CORPORATION (CN)

( * ) Notice: Subject to any disclaimer, the term of this patent is extended or adjusted under 35 U.S.C. 154(b) by 373 days.

This patent is subject to a terminal disclaimer.

(21) Appl. No.: 13/289,983

(22) Filed: Nov. 4, 2011

(65) Prior Publication Data
US 2013/0017656 A1 Jan. 17, 2013

(30) Foreign Application Priority Data

Jul. 15, 2011 (CN) .......................... 2011 1 0197909

(51) Int. Cl.
| | | |
|---|---|---|
| *H01L 21/3205* | (2006.01) | |
| *H01L 21/306* | (2006.01) | |
| *H01L 21/265* | (2006.01) | |
| *H01L 29/66* | (2006.01) | |
| *H01L 29/78* | (2006.01) | |
| *H01L 29/165* | (2006.01) | |
| *H01L 21/308* | (2006.01) | |

(52) U.S. Cl.
CPC ... *H01L 21/30608* (2013.01); *H01L 21/26533* (2013.01); *H01L 29/66636* (2013.01); *H01L 29/7848* (2013.01); *H01L 21/3083* (2013.01); *H01L 29/165* (2013.01)

(58) Field of Classification Search
CPC .............. H01L 21/302; H01L 21/2033; H01L 21/2053; H01L 21/8238; H01L 21/823864; H01L 21/02019; H01L 21/30604; H01L 21/30608; H01L 21/31055; H01L 21/31056; H01L 21/823418; H01L 21/823814; H01L 21/20617; H01L 29/7848; H01L 21/3083; H01L 29/66636; H01L 21/30617
USPC ........... 438/299, 300, 301, 595; 257/E21.43, 257/E21.431
See application file for complete search history.

(56) References Cited

U.S. PATENT DOCUMENTS 5,783,475 A * 7/1998 Ramaswami ................. 438/303
5,972,776 A * 10/1999 Bryant .......................... 438/440

(Continued)

FOREIGN PATENT DOCUMENTS

CN 1190794 A 8/1998

*Primary Examiner* — Khiem D Nguyen
(74) *Attorney, Agent, or Firm* — Innovation Counsel LLP

(57) ABSTRACT

A method of fabricating semiconductor device is provided. First, a recess having a substantially rectangular cross section is formed in a substrate. Then, oxide layers are formed on sidewalls and bottom of the recess by oxygen ion implantation process, wherein oxide layer on sidewalls of recess is thinner than oxide layer on bottom of recess. Thereafter, oxide layer on sidewalls of recess is completely removed, and only a portion of oxide layer on bottom of recess remains. Then, sidewalls of recess are shaped into Σ form by orientation selective wet etching using oxide layer remained on bottom of recess as a stop layer. Finally, oxide layer on bottom of recess is removed. By forming oxide layer on bottom of recess and using it as stop layer in subsequent orientation selective wet etching, the disclosed method can prevent a Σ-shaped recess with a cuspate bottom.

21 Claims, 6 Drawing Sheets

(56) References Cited

U.S. PATENT DOCUMENTS

| | | | |
|---|---|---|---|
| 7,303,999 B1* | 12/2007 | Sriraman et al. | 438/719 |
| 8,372,722 B2* | 2/2013 | Wei et al. | 438/298 |
| 2002/0031898 A1* | 3/2002 | Gonzalez et al. | 438/439 |
| 2003/0099766 A1* | 5/2003 | Jurczak et al. | 427/58 |
| 2009/0302348 A1* | 12/2009 | Adam | H01L 21/26513 257/190 |
| 2011/0062494 A1* | 3/2011 | Engelmann | H01L 21/3065 257/192 |
| 2011/0159655 A1* | 6/2011 | Adam et al. | 438/285 |
| 2011/0220964 A1* | 9/2011 | Shin et al. | 257/183 |
| 2012/0061684 A1* | 3/2012 | Arnold et al. | 257/77 |

* cited by examiner

US 9,449,834 B2

METHOD OF FABRICATING SEMICONDUCTOR DEVICES INCLUDING PMOS DEVICES HAVING EMBEDDED SIGE

CROSS-REFERENCES TO RELATED APPLICATIONS

This application claims priority to Chinese Patent Application No. 201110197909.7, filed on Jul. 15, 2011 and entitled "Method of Fabricating a Semiconductor Device", which is incorporated herein by reference in its entirety. This application is also related to concurrently filed U.S. patent application Ser. No. 13/290,007 (U.S. Pat. No. 8,372,722), entitled "METHOD OF FABRICATING A SEMICONDUCTOR DEVICE," which claims priority to Chinese Patent Application No. 201110197911.4, filed on Jul. 15, 2011 and entitled "Method of Fabricating a Semiconductor Device," both of which are incorporated herein by reference in their entirety.

FIELD OF THE INVENTION

The present invention relates to a method of fabricating semiconductor devices, and particularly to a method of fabricating semiconductor devices including PMOS devices having embedded SiGe (eSiGe).

BACKGROUND OF THE INVENTION

In order to meet the demand of users for low profile electronics, in enhanced Very Large Scale Integration (VLSI) processes, stress engineering has been used to improve performance of devices. One of the effective ways is to utilize embedded SiGe (eSiGe) structures to increase hole mobility in the channel regions of a PMOS device.

In Sigma-shaped ($\Sigma$-shaped) SiGe structures, the stress in the channel regions can be effectively increased since the lattice constant of SiGe is larger than that of Si, and the distance between source and drain regions is reduced by using the $\Sigma$-shaped SiGe.

A prior art method of forming $\Sigma$-shaped SiGe in a PMOS device is shown in FIGS. 1A to 1D. After forming on a Si substrate a gate medium layer (not shown), gate located on the gate medium layer, and sidewall spacers on both sides of the gate (FIG. 1A), a recess which is substantially rectangular in cross section is formed between adjacent gates in the Si substrate by dry etching, as shown in FIG. 1B. For example, the substrate surface can be selected as having (100) orientation.

Next, as shown in FIG. 1C, the substantially rectangular recess is etched using an orientation selective wet etchant, such as an etchant containing Tetramethylammonium hydroxide (TMAH), to expand it into a $\Sigma$-shaped recess. Finally, as shown in FIG. 1D, SiGe is epitaxially grown in the resulting $\Sigma$-shaped recess, so as to form SiGe source and drain regions.

With a thorough study of the prior art methods of forming $\Sigma$-shaped SiGe, it has been found by the inventors of the present invention that the methods of prior art suffer from the problems of difficult epitaxial growth of SiGe and high loading effect.

In the orientation selective wet etching process shown in FIG. 1C, when using an etchant containing TMAH, for example, the etching rate in <100> orientation is far higher than that in <111> orientation. Thereby, with respect to a substrate for which its surface has (100) orientation, it is very difficult to control process conditions to stop the etching before the intersection of (111) crystal planes on opposite sides of the recess. Consequently, orientation selective wet etching tends to result in a recess with cuspate but not flat bottom as shown in FIG. 1E. A recess in such shape may make the subsequent epitaxial growth of SiGe difficult to occur, and may result in defective semiconductor devices.

However, in VLSI fabrication processes, different areas on a substrate may have different device densities. For example, generally, those areas to be used for static random access memory (SRAM) may have a density higher than that of those areas to be used for logic devices. Due to the loading effect associated with wet etching, the etching in the areas with a lower device density is faster than the etching in the areas with a higher device density. Hence, when the orientation selective wet etching process mentioned above is carried out on a bulk substrate, if etching conditions are tuned on the basis of low density devices, under-etching may occur at high density devices; on the contrary, if etching conditions are tuned on the basis of high density devices, $\Sigma$-shaped recesses having cuspate bottoms as shown in FIG. 1E may occur in low density devices.

BRIEF SUMMARY OF THE INVENTION

The present invention is provided to eliminate or at least partially alleviate some or all of the problems identified above in prior art.

Through forming a recess having a substantially rectangular cross section in a substrate by dry etching, and then forming a layer of oxide on the bottom of the substantially rectangular recess by oxygen ion implantation, then performing orientation selective wet etching on the recess using the oxide layer as a stop layer, the embodiments of the present invention may prevent a $\Sigma$-shaped recess with cuspate bottom from forming.

The embodiments of the present invention provide a method of fabricating semiconductor device, which may comprise the following steps: forming a recess having a substantially rectangular cross section in a substrate; performing an oxygen ion implantation process to form oxide layers on sidewalls and bottom of the recess, wherein the oxide layer on the sidewalls of the recess is thinner than the oxide layer on the bottom of the recess; performing a first isotropic wet etching process to completely remove the oxide layer on the sidewalls of the recess and partially remove the oxide layer on the bottom of the recess; performing orientation selective wet etching on the recess using the oxide layer on the bottom of the recess as a stop layer, so as to shape the sidewalls of the recess into $\Sigma$ form; and performing a second isotropic wet etching process to remove the oxide layer on the bottom of the recess. [define $\Sigma$ form]

In one embodiment, the oxygen ion implantation process is performed at implantation energy of 2 keV to 15 keV and implantation dosage of $10^{13}$ atoms/cm$^2$ to $10^{15}$ atoms/cm$^2$.

In one embodiment, the oxygen ion implantation process is performed in a direction substantially parallel to the sidewalls of the recess.

In one embodiment, the thickness of the oxide layer on the bottom of the recess resulted from the oxygen ion implantation process ranges from 5 Å to 100 Å.

In one embodiment, the thickness of the oxide layer on the sidewalls of the recess resulted from the oxygen ion implantation process ranges from 3 Å to 10 Å.

In one embodiment, the thickness of the oxide layer on the bottom of the recess after the first isotropic wet etching process ranges from 2 Å to 97 Å.

In one embodiment, the first isotropic wet etching process is performed by removing the oxide layer using HF solution or HF vapour.

In one embodiment, the second isotropic wet etching process is performed by removing the oxide layer using HF solution or HF vapour.

In one embodiment, the step of forming a recess having a substantially rectangular cross section in the substrate comprises performing dry etching process to form the recess having a substantially rectangular cross section in the substrate.

In one embodiment, the step of forming a recess having a substantially rectangular cross section in the substrate comprises: forming on the substrate a gate medium layer and gate located on the gate medium layer with a top mask layer being formed on top of the gate; forming sidewall spacers on both sides of the gate; performing dry etching process on the substrate using the top mask layer and the sidewall spacers as a mask to form the recess having a substantially rectangular cross section between adjacent sidewall spacers in the substrate.

In one embodiment, the step of performing orientation selective wet etching on the recess comprises: performing wet etching process on the recess with Tetramethylammonium hydroxide (TMAH).

In one embodiment, the etching rate of the orientation selective wet etching in <100> orientation is higher than that in <111> orientation.

In one embodiment, the gate formed on the substrate is polysilicon gate.

In one embodiment, the method further comprises performing epitaxial growth of SiGe in the Σ-shaped recess after the oxide layer on the bottom of the recess has been removed by the second isotropic wet etching.

In one embodiment, the method further comprises performing ion implantation on the substrate to form source and drain regions before performing dry etching on the substrate.

In one embodiment, the method further comprises performing ion implantation on the substrate to form source and drain regions after performing the epitaxial growth of SiGe in the recess.

In one embodiment, the method further comprises forming a mask on top of areas to be formed as NMOS devices and exposing areas to be formed as PMOS devices before performing dry etching on the substrate.

Through forming an oxide layer on the bottom of the recess, which is used as a stop layer in subsequent orientation selective wet etching, the method of embodiments of the disclosure can prevent a Σ-shaped recess having a cuspate bottom from forming.

In the embodiments of the disclosure, the depth of the resulting Σ-shaped recess is primarily dominated by the dry etching, and therefore the method of this disclosure can achieve relatively lower loading effect value.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention. The same reference labels in various drawings will refer to the same parts or steps.

The present invention can be more clearly understood from the following detailed description with reference to the drawings, wherein:

FIGS. 1A to 1D show a prior art method of forming Σ-shaped SiGe in a PMOS device, wherein FIG. 1A shows forming a gate on a substrate, and sidewall spacers on both sides of the gate; FIG. 1B shows performing dry etching to form a recess having a substantially rectangular cross section in the substrate between adjacent gates; FIG. 1C shows performing orientation selective wet etching on the rectangular recess to expand it into Σ shape; and FIG. 1D shows the epitaxial growth of SiGe in the Σ-shaped recess to form SiGe source and drain regions;

FIGS. 3A to 3F schematically show cross-section views of various steps of the method of forming the Σ-shaped recess in FIG. 2, wherein FIG. 3A shows forming on a substrate a gate medium layer, gate on the gate medium layer, a top mask layer on top of the gate, and sidewall spacers on both sides of the gate; FIG. 3B shows with the top mask layer and the sidewall spacers as a mask, performing dry etching process to form a recess having a substantially rectangular cross section in the substrate between adjacent gate spacers; FIG. 3C shows performing oxygen ion implantation process to form oxide layers having different thicknesses on the bottom and sidewalls of the recess; FIG. 3D shows performing isotropic wet etching process to completely remove the oxide layer on the sidewalls of the recess and partially remove the oxide layer on the bottom of the recess; FIG. 3E shows performing an orientation selective wet etching on the recess using the oxide layer on the bottom of the recess as a stop layer, so as to expand the recess into Σ shape; and FIG. 3F shows removing the remaining oxide layer on the bottom of the recess.

DETAILED DESCRIPTION OF THE INVENTION

Figure 1A:
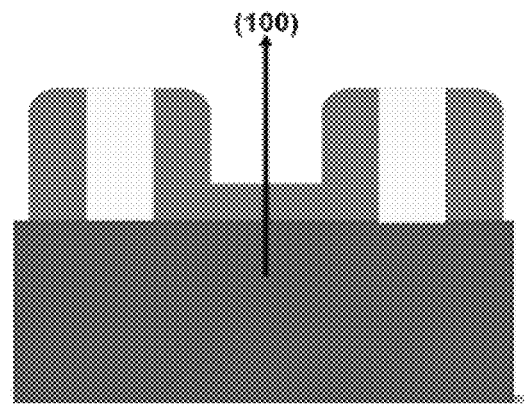
Figure 1B:
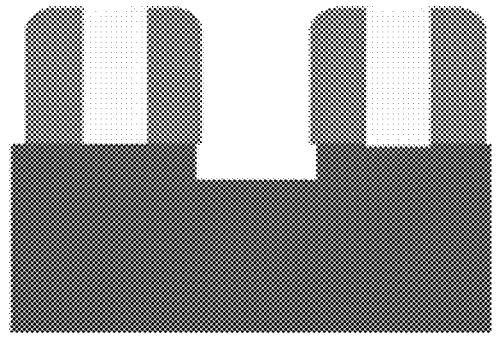
Figure 1C:
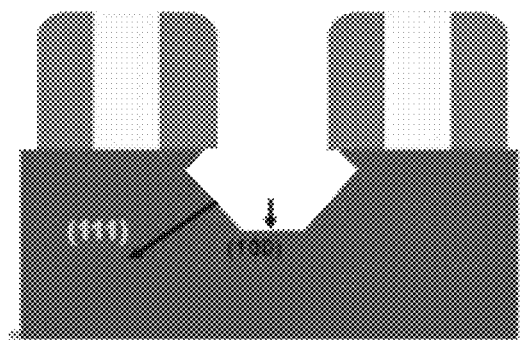
Figure 1D:
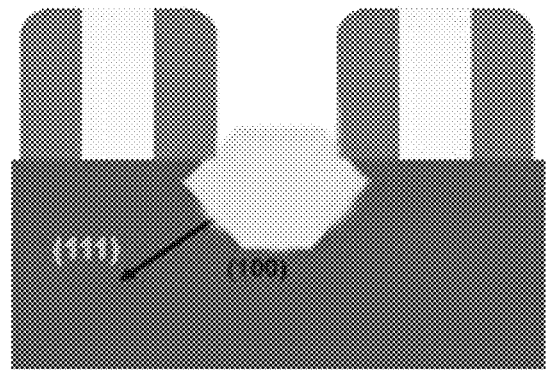
Figure 1E:
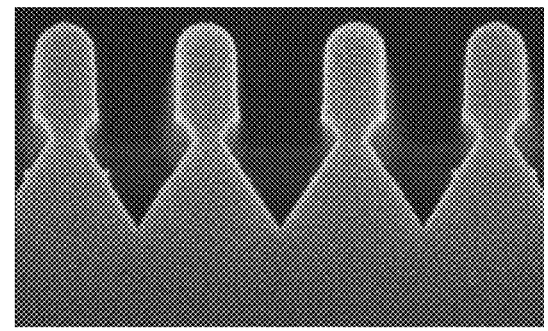
FIG. 1E shows the recess having a cuspate bottom formed in the substrate resulted from orientation selective wet etching.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

At the same time, it should be appreciated that, for the convenience of description, various parts shown in the figures are not illustrated in actual proportion.

The following description of at least one exemplary embodiment is merely illustrative in nature and is in no way intended to limit the invention, its application, or uses.

Techniques, methods, and apparatus as known by one of ordinary skill in the relevant art may not be discussed in detail but are intended to be part of the mandated specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for subsequent figures.

In the embodiments of the present disclosure, the formation of a Σ-shaped recess in a substrate can be divided into three steps: first, a recess having a substantially rectangular cross section is formed between adjacent gates in a substrate by dry etching process; next, oxide layers are formed on the sidewalls and bottom of the recess by oxygen ion implantation process, wherein the oxide layer on the sidewalls of the recess is thinner than the oxide layer on the bottom of the recess, then, the oxide layer on the sidewalls of the recess is removed by an isotropic wet etching process while only a portion of the oxide layer on the bottom of the recess remains; last, the sidewalls of the recess are shaped into Σ form by orientation selective wet etching using the oxide layer remained on the bottom of the recess as a stop layer, then the oxide layer remained on the bottom of the recess is removed by an isotropic wet etching process.

Figure 2:
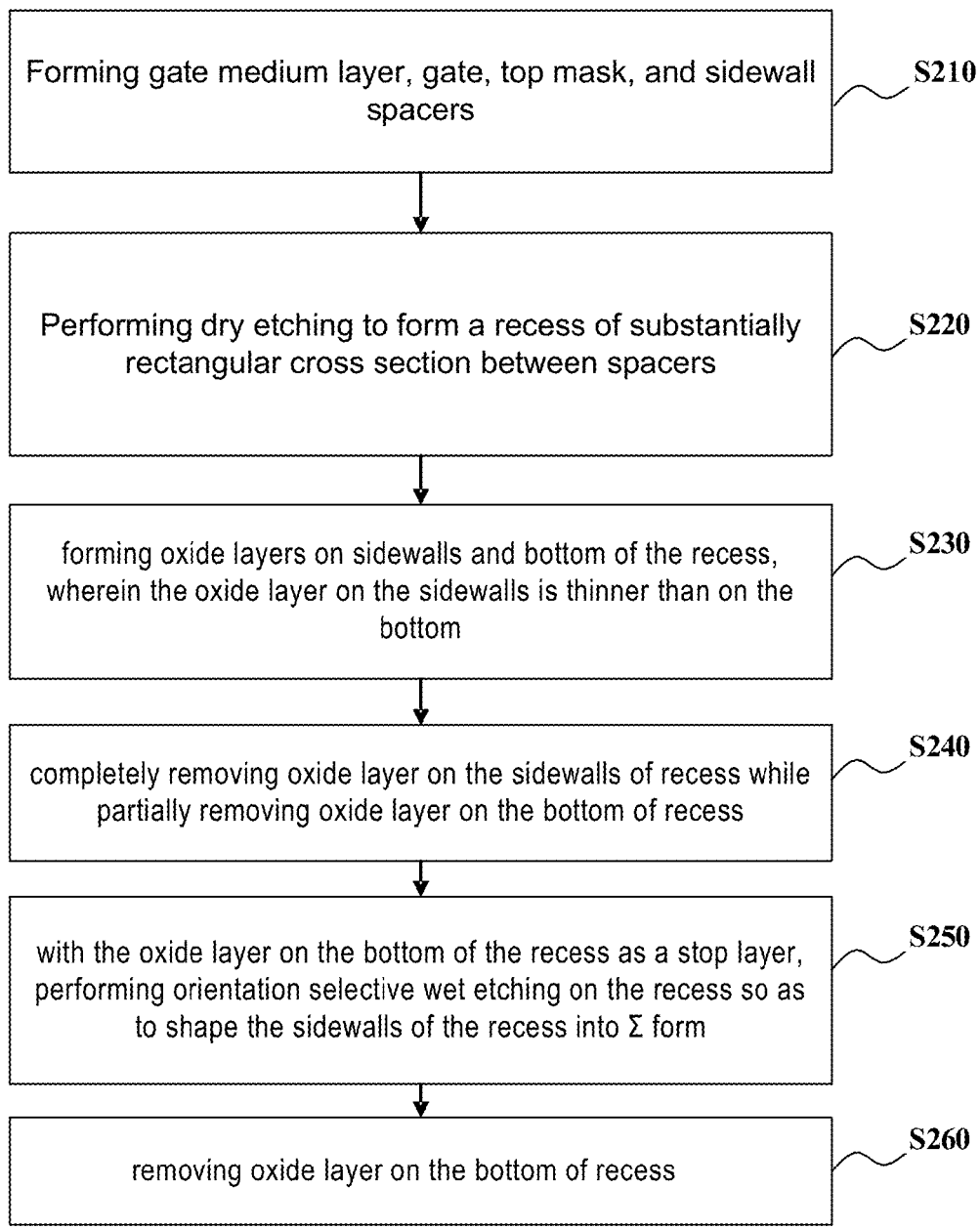
FIG. 2 schematically shows a flowchart of a method of forming a Σ-shaped recess in a PMOS device according to one embodiment of the disclosure.

FIG. 2 shows a flowchart of a method of forming a Σ-shaped recess in a substrate of a PMOS device according to one embodiment of the disclosure. FIGS. 3A to 3F show cross-section views of various steps of the method of forming the Σ-shaped recess in FIG. 2. Below, the embodiment of the present disclosure will be described in detailed with reference to FIG. 2 and FIGS. 3A to 3F.

Figure 3A:
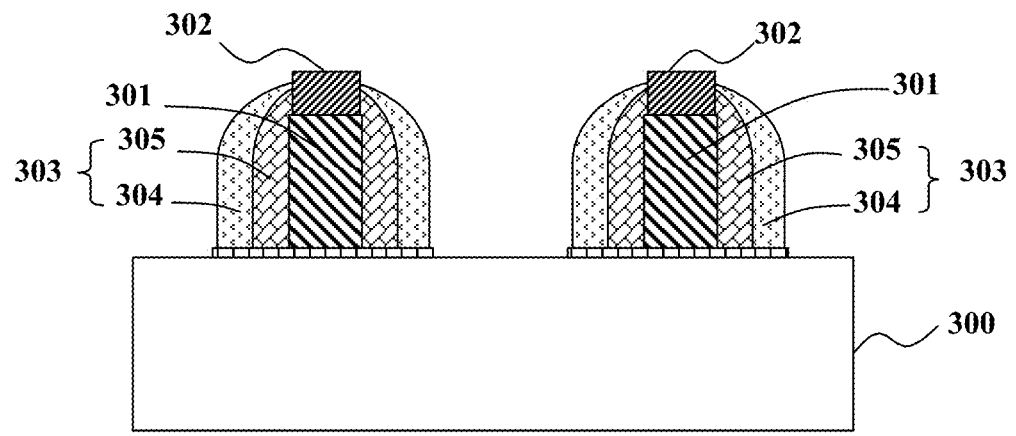

First, at step S210 in FIG. 2 and as illustrated in FIG. 3A, a substrate 300 is provided, with a gate medium layer formed on the substrate 300, and gate 301 formed on the gate medium layer, a top mask layer 302 formed on top of the gate 301, and sidewall spacers 303 formed on both sides of the gate (see FIG. 3A). In the present embodiment, the sidewall spacers 303 include offset spacers 305 closer to the gate 301 and main spacers 304 located outside of the offset spacers 305. In other embodiments, the sidewall spacers 303 can have other configurations, such as, a single layer of spacer or three or more layers of spacers.

The substrate may be made of silicon, for example. The gate medium layer may be silicon oxide, for example. The gate in the present embodiment may be, for example, polysilicon gate. The top mask layer 302 and the sidewall spacers 303 are used to protect the gate 301 in subsequent dry etching, oxygen ion implantation, wet etching, and ion implantation processes to form source/drain region. The top mask layer 302 may be, for example, silicon nitride. The main spacers 304 may be, for example, silicon nitride, and the offset spacers 305 may be, for example, silicon oxide. The gate 301, top mask layer 302, and sidewall spacers 303 can be formed by processes that are well known for those skilled in the art, descriptions of which are omitted for the purpose of simplicity.

Figure 3B:
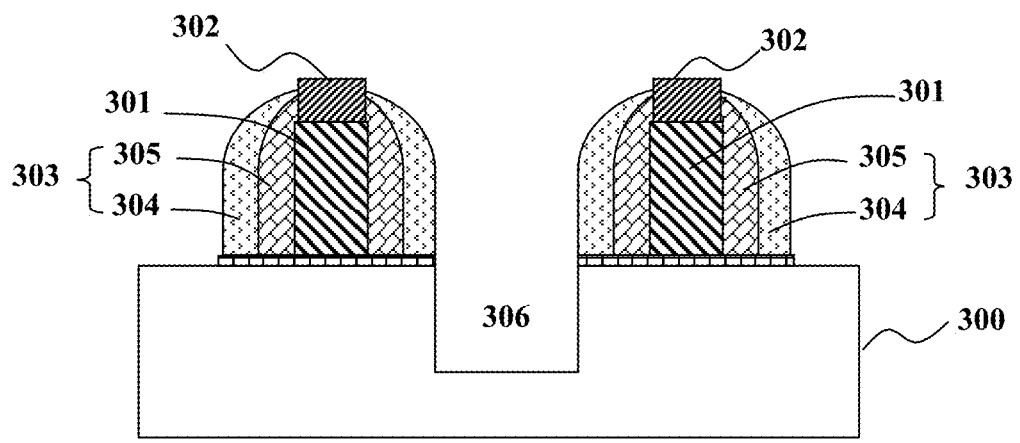

Next, at step S220 in FIG. 2, the substrate 300 is dry etched using the top mask layer 302 and the sidewall spacers 303 as a mask, so as to form a recess 306 in the substrate between adjacent sidewall spacers 303. As shown in FIG. 3B, the recess 306 is substantially rectangular in its cross section. Here, the dry etching can adopt HBr or Cl2 as main reactive gases.

It should be noted that although the substantially rectangular recess formed in the substrate between adjacent gates is illustrated in the present embodiment, in other embodiments, the recess can also be formed in other areas, for example, in the substrate between a shallow trench isolation structure and a gate.

In addition, it should be noted that although the recess 306 is illustrated in FIG. 3B to have a substantially rectangular cross section, recesses with other section shapes are also possible in other embodiments, such as a "U" shaped section.

Figure 3C:
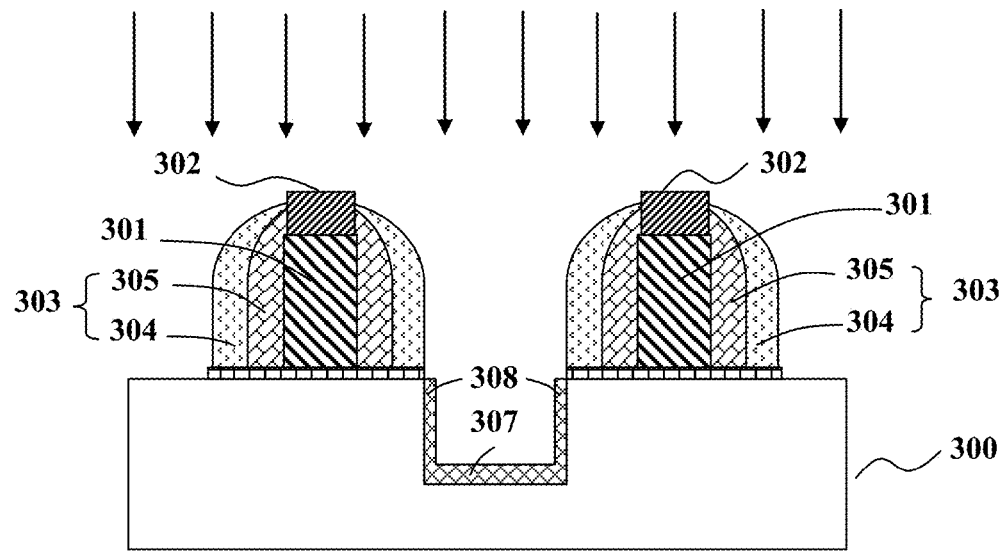

Then, at step S230 in FIG. 2 and illustrated in FIG. 3C, an oxygen ion implantation process is performed on the substrate 300 to form an oxide layer 307 on the bottom of the recess 306 and an oxide layer 308 on the sidewalls of the recess 306. The oxide layers 307, 308 are, for example, silicon oxide layers. As shown in FIG. 3C, the oxide layer 308 on the sidewalls of the recess is thinner than the oxide layer 307 on the bottom of the recess. In one embodiment, the oxide layer 307 on the bottom of the recess can be 5 Å to 100 Å thick, and the oxide layer 308 on the sidewalls of the recess can be 3 Å to 10 Å thick.

In one example, oxygen ions can be implanted into the substrate 300 at implantation energy of 2 keV to 15 keV and implementation dosage of $10^{13}$ atoms/cm$^2$ to $10^{15}$ atoms/cm$^2$. As shown in FIG. 3C, oxygen ions can be implanted into the recess 306 in a direction as indicated by the arrows 309 (i.e., in a direction substantially parallel to the sidewalls of the recess 306). In the present embodiment, since the implanting direction of oxygen ions is substantially parallel to the sidewalls of the recess 306, oxidation essentially occurs on the bottom of the recess, and thus, the oxide layer 307 formed on the bottom of the recess is far thicker than the oxide layer 308 formed on the sidewalls of the recess. In some embodiments, a thermal process may be used to enhance the oxidation process.

Figure 3D:
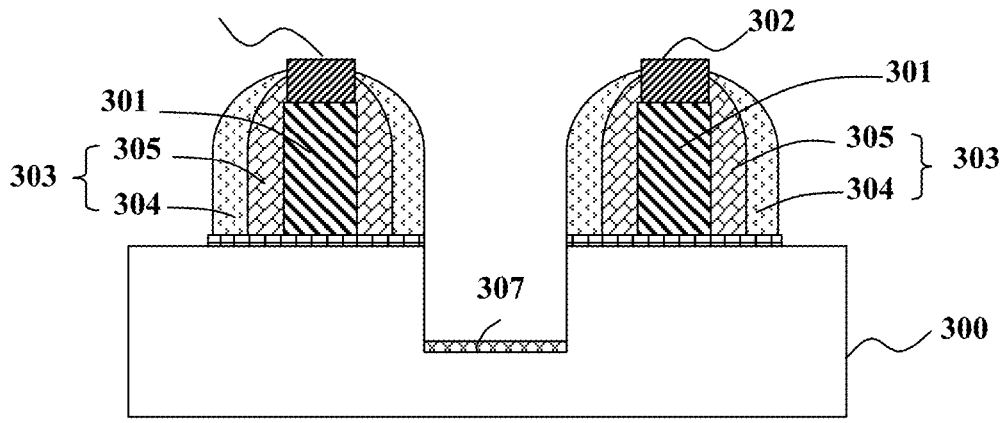

Next, at step S240 in FIG. 2, by use of isotropic wet etching such as using HF solution or HF vapour, or other oxide removing processes that are well known in the art, the oxide layer 308 on the sidewalls of the recess is completely removed and the oxide layer 307 on the bottom of the recess is partially removed, as shown in FIG. 3D. For example, in the case that the oxide layer 307 formed on the bottom of the recess at step S230 is of thickness of 5 Å to 100 Å, the oxide layer 307 on the bottom of the recess after the wet etching at step S240 can be 2 Å to 97 Å in thickness.

Figure 3E:
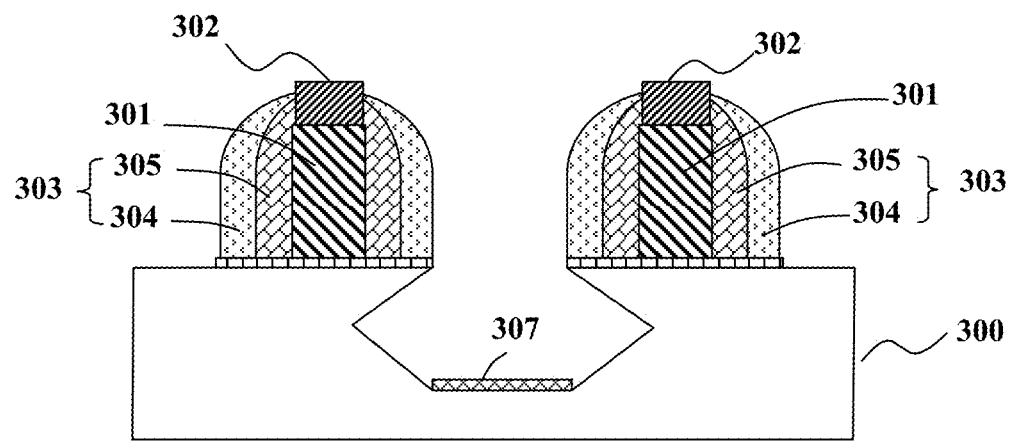

Thereafter, at step S250 in FIG. 2, taking the oxide layer 307 on the bottom of the recess as a stop layer, the recess 306 is subject to orientation selective wet etching to shape the inner walls of the recess 306 into Σ form, as shown in FIG. 3E. In one embodiment, the etching can be performed with Tetramethylammonium hydroxide (TMAH) of 10% to 25% mass concentration at a temperature of 70° C. to 90° C.

Due to the presence of the oxide layer 307, the etching in the <100> orientation is stopped in the above orientation selective wet etching process. As a result, the Σ-shaped recess having a cuspate bottom can be avoided. Furthermore, the depth of the resulting Σ-shaped recess is primarily dominated by the dry etching at step S220, and therefore, the method of the embodiments of the present disclosure can achieve a satisfied loading effect value in the orientation selective wet etching process. In the present disclosure, "loading effect value" is defined as the ratio of etching depths at different device areas in a same substrate. In the present embodiment, the loading effect value may range from 1% to 5%.

Figure 3F:
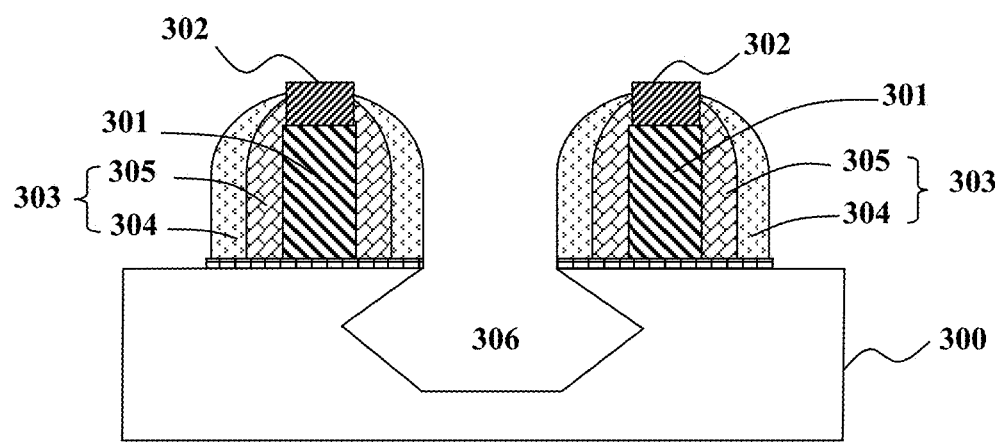

Finally, at step S260 of FIG. 2 as illustrated in FIG. 3F, the oxide layer 307 on the bottom of the recess is removed by isotropic wet etching, so as to form a Σ-shaped recess 306 to be used for subsequent epitaxial growth of SiGe, as shown in FIG. 3F. In one embodiment, the above-mentioned wet etching can be performed by use of HF solution or HF vapour, or other well-known processes to remove silicon oxides.

It should be noted that, before the dry etching in the substrate (i.e., the step S220 of FIG. 2) or after epitaxial growth of SiGe in the recess, ion implantation can be performed in the substrate to form source and drain regions.

It should be noted that, eSiGe structures functioning as source/drain regions generally work in PMOS transistors. Thereby, with respect to semiconductor devices having both PMOS and NMOS transistors, it is necessary to shield the portions of NMOS transistors with a mask or the like during the formation of PMOS transistors into Σ shape.

By forming a silicon oxide layer on the bottom of the recess, which is used as a stop layer in the subsequent orientation selective wet etching, the method of the embodiments of the present disclosure can prevent a Σ-shaped recess with a cuspate bottom and can achieve a lower loading effect value. In the embodiments described above, the resultant recess is referred to as a Σ-shaped recess. Here, the sidewalls include two planar surfaces having different crystalline orientations. In other embodiments, the methods can also be used to form a recess having a wider middle portion than an upper portion and a lower portion.

Thus, the method of fabricating semiconductor device has been described in detail according to the present invention. Some details that are well known in the art are not discussed for the purpose of not obscuring the concept of present invention. From the above description, those skilled in the art can thoroughly understand how to implement the technique solutions disclosed herein.

Although some specific embodiments of this invention have been illustrated in detail by way of examples, those skilled in the art will appreciate that the above examples are merely illustrative and are not intended to limit the scope of this invention. It should be understood by a person skilled in the art that the above embodiments can be modified without departing from the scope and spirit of the present invention. The scope of the present invention is defined by the attached claims.

What is claimed is:

1. A method of fabricating a semiconductor device, the method comprising:
   forming a gate medium layer on a substrate;
   forming a gate on a top side of the gate medium layer;
   forming a mask layer on the gate;
   forming sidewall spacers on two sides of the gate and on the top side of the gate medium layer; and
   performing a dry etching process on the substrate using the mask layer and the sidewall spacers as a mask to form a first recess in the substrate;
   performing an oxygen ion implantation process to form side oxide layers on sidewalls of the first recess and to form a bottom oxide layer on a bottom of the first recess;
   performing a first isotropic wet etching process to completely remove the side oxide layers and to partially remove the bottom oxide layer to form a remaining oxide layer;
   performing orientation selective wet etching using the remaining oxide layer as a stop layer, so as to form a shaped recess in a remaining substrate; and
   performing a second isotropic wet etching process to remove the remaining oxide layer.

2. The method according to claim 1, wherein the oxygen ion implantation process is performed at implantation energy of 2 keV to 15 keV and implantation dosage of $10^{13}$ atoms/cm$^2$ to $10^{15}$ atoms/cm$^2$.

3. The method according to claim 1, wherein the oxygen ion implantation process is performed in a direction substantially parallel to the sidewalls of the first recess.

4. The method according to claim 1, wherein a thickness of the bottom oxide layer is in a range from 5 Å to 100 Å.

5. The method according to claim 1, wherein a thickness of each of the side oxide layers is in a range from 3 Å to 10 Å.

6. The method according to claim 1, wherein a thickness of the remaining oxide layer is in a range from 2 Å to 97 Å.

7. The method according to claim 1, wherein at least one of the first isotropic wet etching process and the second isotropic wet etching process is performed using hydrogen fluoride (HF) solution or HF vapour.

8. The method according to claim 1, wherein the first recess has a substantially rectangular cross section.

9. The method according to claim 1, wherein each of the side oxide layers is both thinner and taller than the bottom oxide layer and has a completely exposed top side.

10. The method according to claim 1, wherein the gate formed on the substrate is a polysilicon gate.

11. The method according to claim 1, wherein the orientation selective wet etching is performed using Tetramethylammonium hydroxide (TMAH).

12. The method according to claim 1, wherein an etching rate of the orientation selective wet etching in a <100> orientation is higher than that in a <111> orientation.

13. The method according to claim 1, further comprising:
   performing ion implantation on the substrate to form source and drain regions before forming the first recess in the substrate.

14. The method according to claim 1, further comprising:
   performing epitaxial growth of silicon germanium (SiGe) in the shaped recess after the remaining oxide layer has been removed.

15. The method according to claim 14, further comprising:
   performing ion implantation on the remaining substrate to form source and drain regions after performing the epitaxial growth of silicon germanium (SiGe) in the shaped recess.

16. The method according to claim 1, wherein the semiconductor device has different device areas that have different device densities, wherein different etch depths are implemented at the different device areas, the method comprising:
   forming a mask on top of areas that are designated to form n-type metal-oxide-semiconductor (NMOS) devices and exposing areas that are designated to form p-type metal-oxide-semiconductor (PMOS) devices before performing dry etching on the substrate to form the first recess.

17. A method of fabricating a semiconductor device, the method comprising:
   forming a gate medium layer on the substrate;
   forming a gate on the gate medium layer;
   forming a mask layer on the gate;
   forming two sidewall spacers on two sides of the gate; and
   performing a dry etching process on the substrate using the mask layer and the two sidewall spacers as a mask to form a first recess in the substrate;
   performing an oxygen ion implantation process to form side oxide layers on sidewalls of the first recess and to form a bottom oxide layer on a bottom of the first recess, wherein both the side oxide layers are spaced from both the two sidewall spacers;

performing a first isotropic wet etching process to completely remove the side oxide layers and to partially remove the bottom oxide layer to form a remaining oxide layer;

performing an orientation selective wet etching process using the remaining oxide layer as a stop layer, so as to form a shaped recess in a remaining substrate; and performing a second isotropic wet etching process to remove the remaining oxide layer.

18. The method according to claim 17, wherein the orientation selective wet etching process comprises using a solution including Tetramethylammonium hydroxide (TMAH).

19. The method according to claim 17, further comprising:

performing a thermal process on the side oxide layers and the bottom oxide layer after performing the oxygen ion implantation process.

20. A method of fabricating a semiconductor device, the method comprising:

forming two gate members on a substrate;

forming two spacers between the two gate members;

forming a first recess in a substrate;

forming two side oxide layers on two sidewalls of the first recess and forming a bottom oxide layer on a bottom of the first recess, wherein both the two side oxide layers are spaced from both the two spacers;

performing a first isotropic wet etching process to completely remove the two side oxide layers and to partially remove the bottom oxide layer to form a remaining oxide layer;

performing orientation selective wet etching using the remaining oxide layer as a stop layer, so as to form a shaped recess in a remaining substrate; and performing a second isotropic wet etching process to remove the remaining oxide layer.

21. The method of claim 20, wherein each of the two side oxide layers is thinner than the bottom oxide layer, wherein the two sidewalls of the first recess respectively abut the two side oxide layers and are respectively coplanar with two sides of the two spacers, and wherein a minimum distance between the two side oxide layers is less than a minimum distance between the two sides of the two spacers.

* * * * *